(12) United States Patent
Mohn et al.

(10) Patent No.: US 7,011,039 B1
(45) Date of Patent: Mar. 14, 2006

(54) MULTI-PURPOSE PROCESSING CHAMBER WITH REMOVABLE CHAMBER LINER

(75) Inventors: Jonathan D. Mohn, Saratoga, CA (US); John J. Helmsen, Sunnyvale, CA (US); Michael Barnes, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 922 days.

(21) Appl. No.: 09/611,817

(22) Filed: Jul. 7, 2000

(51) Int. Cl.
H01L 21/00 (2006.01)

(52) U.S. Cl. .................................... 118/723 R

(58) Field of Classification Search ............... 156/345, 156/916; 118/715, 719, 723 R
See application file for complete search history.

(56) References Cited

U.S. PATENT DOCUMENTS

| 4,441,407 A | * | 4/1984 | Rieger ........................ 99/277.2 |
| 5,186,718 A | | 2/1993 | Tepman et al. ............ 29/25.01 |
| 5,516,367 A | | 5/1996 | Lei et al. .................... 118/725 |
| 5,730,801 A | * | 3/1998 | Tepman et al. ............. 118/719 |
| 5,788,799 A | * | 8/1998 | Steger et al. .......... 156/345.37 |
| 5,820,723 A | | 10/1998 | Benjamin et al. ............ 156/345 |
| 5,885,356 A | * | 3/1999 | Zhao et al. ........... 118/723 ER |
| 5,891,350 A | * | 4/1999 | Shan et al. .................... 216/71 |
| 5,952,060 A | * | 9/1999 | Ravi .......................... 427/577 |
| 6,063,233 A | * | 5/2000 | Collins et al. .......... 156/345.37 |
| 6,245,190 B1 | * | 6/2001 | Masuda et al. ......... 156/345.46 |
| 6,251,216 B1 | * | 6/2001 | Okamura et al. ......... 156/345.1 |
| 6,264,788 B1 | * | 7/2001 | Tomoyasu et al. ..... 156/345.43 |
| 6,277,237 B1 | * | 8/2001 | Schoepp et al. .......... 156/345.1 |

FOREIGN PATENT DOCUMENTS

| EP | 0 680 072 A2 | 11/1995 |
| EP | 814495 A2 * | 12/1997 |
| WO | WO 9708734 * | 3/1997 |

* cited by examiner

Primary Examiner—Parviz Hassanzadeh
Assistant Examiner—Michelle Crowell
(74) Attorney, Agent, or Firm—Patterson & Sheridan L.L.P.

(57) ABSTRACT

A multi-purpose chamber that can be configured for a variety of processes, including deposition processes and etch processes, for example, by installing one or more removable chamber liners. The multi-purpose chamber provides uniform plasma confinement around a substrate disposed in the chamber for various processing conditions. The multi-purpose chamber also provides efficient and uniform exhaust of processing gas from the chamber.

11 Claims, 9 Drawing Sheets

MULTI-PURPOSE PROCESSING CHAMBER WITH REMOVABLE CHAMBER LINER

BACKGROUND OF THE INVENTION

1. Field of the Invention

The invention generally relates to substrate processing systems. More particularly, the invention relates to a substrate processing system that can perform a variety of processes.

2. Background of the Related Art

Process chambers are typically utilized for fabrication of integrated circuits. Typically, a variety of processes are performed on a semiconductor substrate to form devices and other components of the integrated circuit. These processes may include etch, chemical vapor deposition, physical vapor deposition, and other plasma or non-plasma processes. A number of related or sequential processes may be performed on a semiconductor substrate utilizing a fabrication platform having a plurality of specific processing chambers. Each processing chamber on the platform is typically designed and configured to perform a specific process or a specific type of process for a specific type of substrate. For example, an etch chamber is typically machined or milled from a block of aluminum or other suitable materials to form an interior volume that is specifically designed for performing an etch process on a substrate of a particular size, and the etch chamber may include attachments to other equipment for performing the etch process, including exhaust systems, gas supply system, power sources, etc., which are specifically configured for performing the etch process. The processing chambers on a platform typically can not be reconfigured practically to perform other processes.

Since the processing chambers on a platform are typically configured to perform a particular sequence of processes, when a different sequence or type of process is required, a new platform having a new processing chamber configured for the required different process is needed. Replacing fabrication platforms imposes substantial capital costs to the fabrication equipment and other costs associated with down time and installation of the new platform.

Another problem typically encountered in conventional processing chambers is that the exhaust systems typically do not provide uniform and efficient pumping of the process gases from the processing region in the chamber to the chamber exhaust outlet. In conventional processing chambers, the uniformity of process gas flow and the efficiency of process gas exhaust are limited by a variety of factors, such as the interior volume of the chamber, the placement of the substrate support member in the chamber, the size of the exhaust outlet, and the position of the exhaust outlet. Processing chambers typically have a substantially cylindrical interior volume containing a fixed or movable substrate support member. Process gases are generally exhausted from the interior volume through a hole in the side of the processing chamber, such as described in U.S. Pat. No. 5,516,367, or through a hole in the bottom of the chamber below a cantilevered substrate support member, such as described in U.S. Pat. No. 5,820,723. The substrate support member often obstructs the flow of exhaust gases or otherwise results in non-uniform exhausting of the process chamber. This non-uniform exhausting of gases may lead to non-uniform processing results. Furthermore, the exhaust outlet may limit conductance from the chamber to the exhaust system because of the size of the exhaust outlet, and because the exhaust outlet typically forms an abrupt transition with the chamber wall, which obstructs smooth flow of the process gases to the exhaust outlet.

Therefore, there is a need for a multi-purpose chamber that can be configured for a variety of processes, including etch processes, chemical vapor deposition processes, and physical vapor deposition processes, for example. It would be desirable for the multi-purpose chamber to provide efficient and uniform exhaust of processing gas from the chamber.

SUMMARY OF THE INVENTION

A multi-purpose chamber that can be configured for a variety of processes, including deposition processes and etch processes, for example, is provided. The multi-purpose chamber provides uniform plasma confinement around a substrate disposed in the chamber for various processing conditions. The multi-purpose chamber also provides efficient and uniform exhaust of processing gas from the chamber.

One aspect of the invention provides an apparatus for processing a semiconductor substrate, comprising a chamber body having an internal volume defined by first and second substantially cylindrical regions and by side walls extending between the first and second cylindrical regions. A substrate support is disposed in the internal volume within the first substantially cylindrical region, and an exhaust system is connected to a chamber outlet disposed in fluid communication with the second cylindrical region. The chamber body receives a variety of chamber liners or inserts to conduct a variety of etch processes and deposition processes.

Another aspect of the invention is the provision of a chamber body capable of receiving various inserts. The various inserts are shaped so as to define various interior chamber designs, each advantageous to a particular process. Thus, the exterior of the chamber is fixed and defined by the chamber body, while the interior of the chamber is variable and defined by the various inserts.

Another aspect of the invention provides a chamber liner defining a process region, an exhaust region, and a passage region between the process region and the exhaust region. The chamber liner is fitted to a fixed chamber body. Thus, in order to modify the size or shape of either the process region, the exhaust region, or the passage region, one need only replace the chamber liner. In a further aspect of the invention, the passage region includes traps to prevent plasma escaping from the process region into the passage or exhaust regions.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
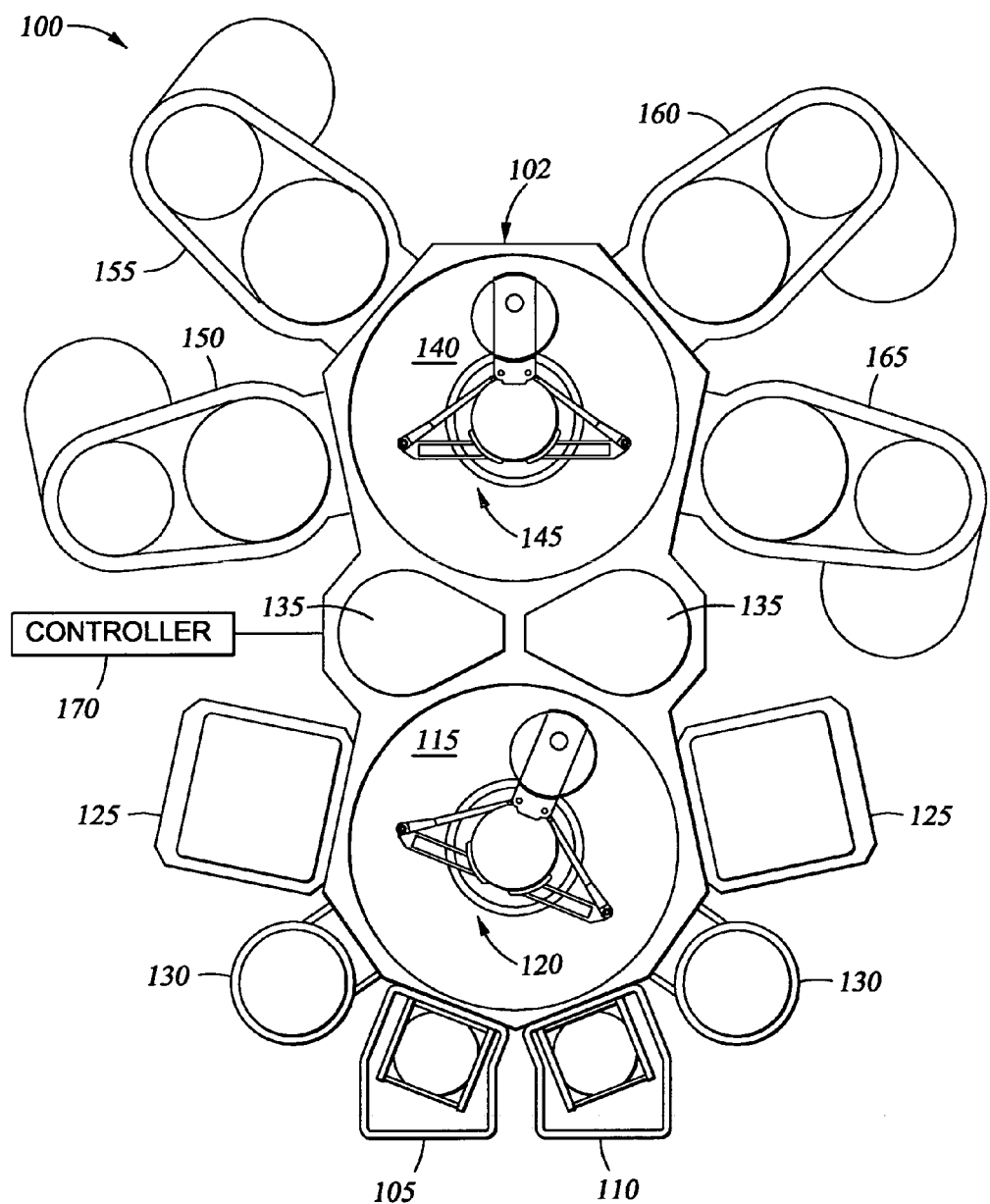
FIG. 1 is a schematic view of a cluster tool system having a plurality of substrate processing chambers.

FIG. 1 is a schematic view of a cluster tool system having a plurality of substrate processing chambers. The cluster tool system 100 is a two-staged vacuum processing system defined by a mainframe or platform 102 having a plurality of modules or chamber attached thereto. An example of a commercial embodiment of a two-staged vacuum processing platform is the Endura® platform, available from Applied Materials, Inc., Santa Clara, Calif., which is described in U.S. Pat. No. 5,186,718, Tepman et al., hereby incorporated by reference in its entirety.

The cluster tool system 100 includes vacuum load-lock chambers 105 and 110 attached to a first stage transfer chamber 115. The load-lock chambers 105 and 110 maintain vacuum conditions within the first stage transfer chamber 115 while substrates enter and exit system 100. A first robot 120 transfers substrates between the load-lock chambers 105 and 1110 and one or more substrate processing chambers 125 and 130 attached to the first stage transfer chamber 115. Processing chambers 125 and 130 can be selected from a number of substrate processing chambers, such as etch, chemical vapor deposition (CVD), physical vapor deposition (PVD), pre-clean, degas, orientation and other substrate processing chambers. The first robot 120 also transfers substrates to/from one or more transfer chambers 135 disposed between the first stage transfer chamber 115 and a second stage transfer chamber 140.

The transfer chambers 135 are used to maintain ultrahigh vacuum conditions in the second stage transfer chamber 140 while allowing substrates to be transferred between the first stage transfer chamber 115 and the second stage transfer chamber 140. A second robot 145 transfers substrates between the transfer chambers 135 and a plurality of substrate processing chambers 150, 155, 160 and 165 according to an embodiment of the invention. Unlike processing chambers 125 and 130, the processing chambers 150 to 165 can be configured to perform a variety of substrate processing operations. For example, the processing chamber 150 may be a CVD chamber configured to deposit a dielectric film; the processing chamber 155 may be an etch chamber configured to etch apertures or openings in a dielectric film for forming interconnect features; the processing chamber 160 may be a PVD chamber configured to deposit a barrier film; and the processing chamber 165 may be a PVD chamber configured to deposit a metal film. As will be detailed below, each of the chambers 150 to 165 can be easily reconfigured by simply changing the liner.

A controller 170 may control the overall operation of the cluster tool system 100 and the individual processes performed in each of the substrate processing chambers. The controller 170 may include a microprocessor or computer (not shown) and a computer program executed by a microprocessor or computer. Substrates are brought to vacuum load-lock chambers 105 and 110 by a conveyor belt or robot system (not shown) controlled by the controller. The robots 120 and 145 are also operated by the controller to transfer substrates between the various processing chambers of the cluster tool system 100. Additionally, the controller may control and/or coordinate with other components or systems connected to the cluster tool system 100.

Figure 2:
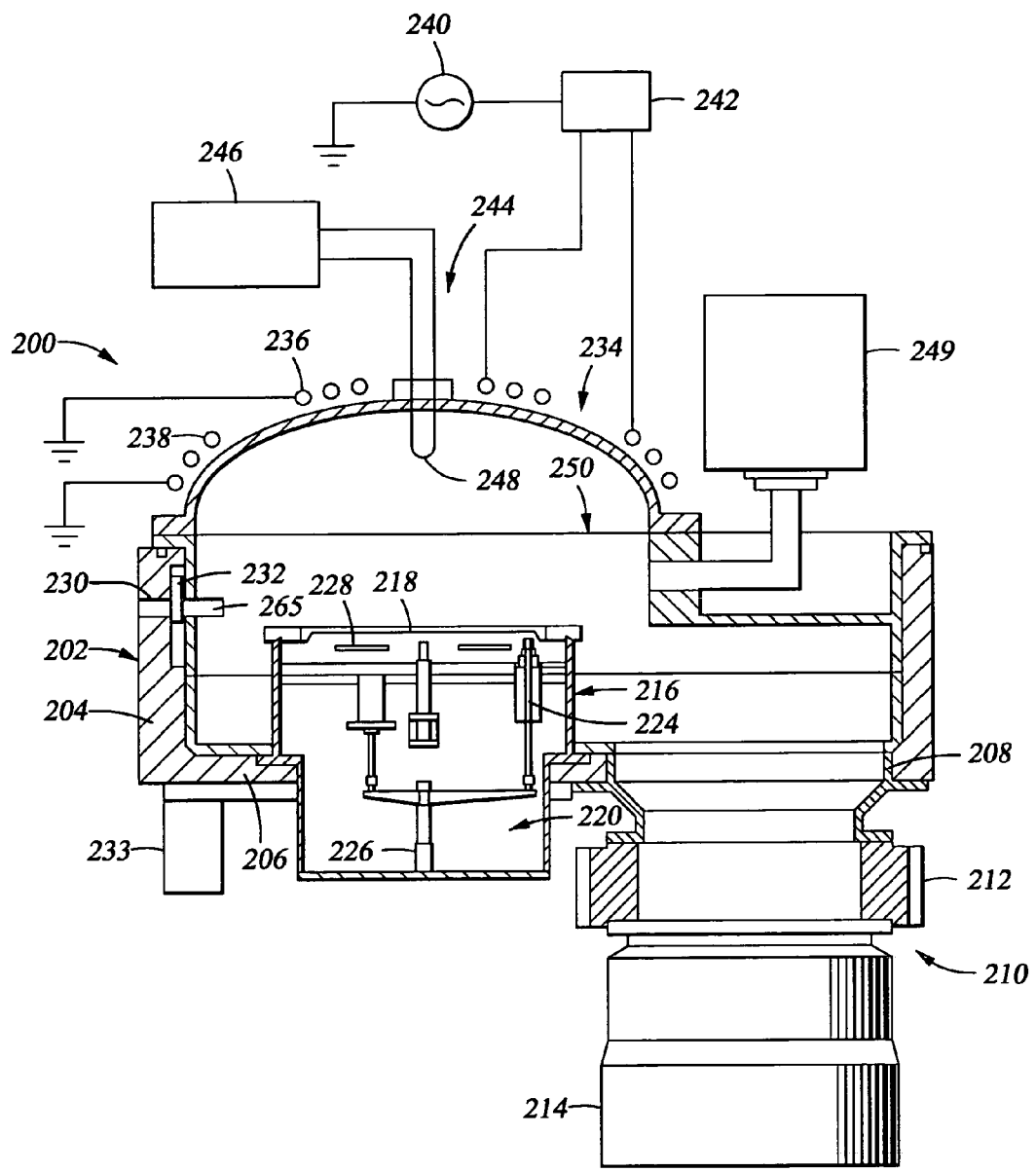
FIG. 2 is a cross sectional view of a multi-purpose chamber of the invention shown with a domed lid and inductive coils.
Figure 3:
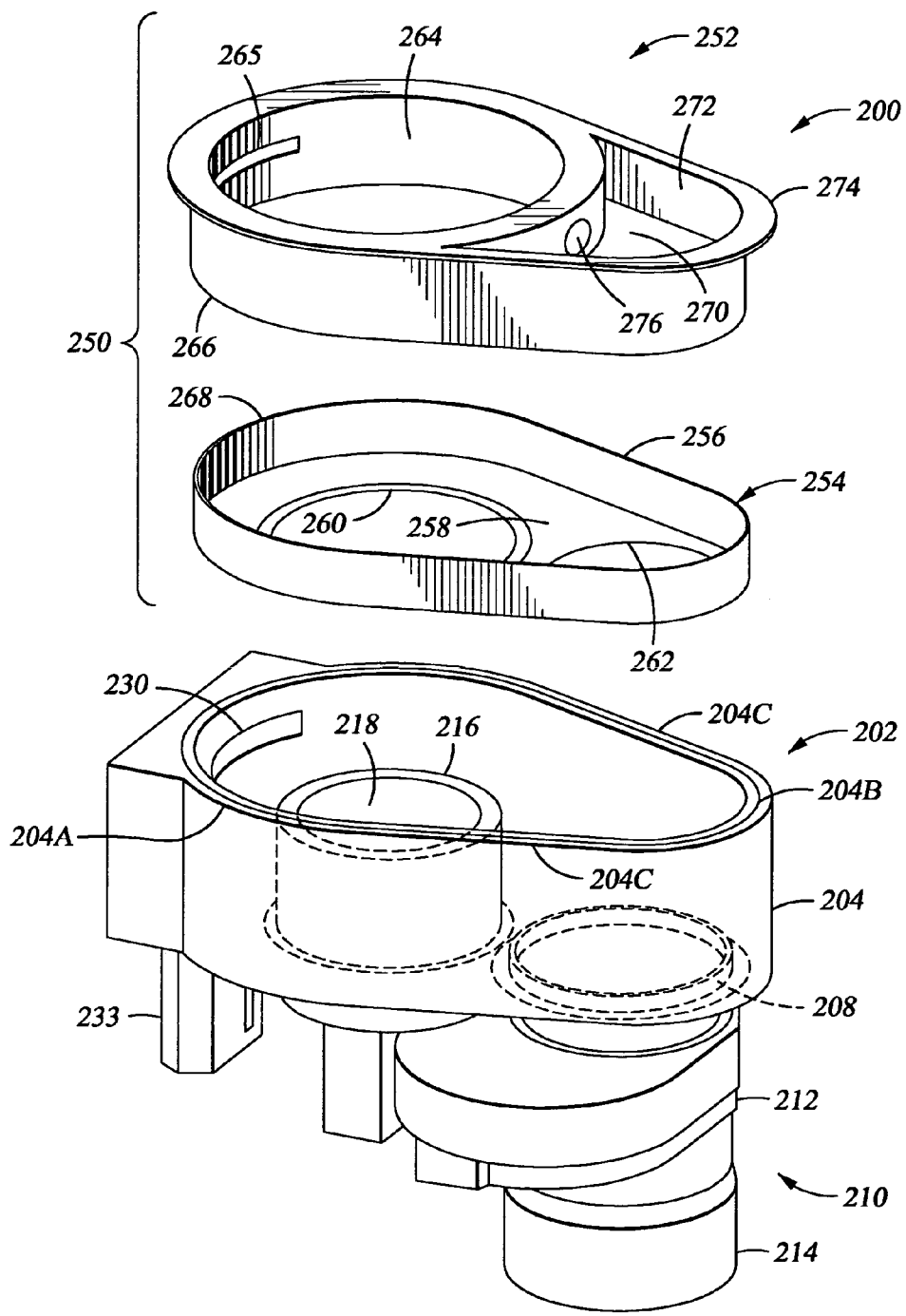
FIG. 3 is an exploded perspective view of a multi-purpose chamber having a two-piece liner.

FIG. 2 is a cross sectional view of a multi-purpose chamber of the invention. FIG. 3 is an exploded perspective view of a multi-purpose chamber having a two-piece liner. A multi-purpose chamber 200 can be attached to the platform 102 as a processing chamber and configured to perform a variety of one or more specific processes, such as deposition or etch processes. Referring to both FIGS. 2 and 3, the multi-purpose chamber 200 includes a chamber body 202 having a chamber wall 204 and a chamber bottom 206. The chamber wall 204 extends substantially perpendicularly from the edge of the chamber bottom 206. The chamber bottom 206 includes an outlet 208 for exhausting gases from the chamber. An exhaust system 210 is attached to the outlet 208 of the chamber bottom 206. The exhaust system 210 may include a throttle valve 212 and a vacuum pump 214. A variety of commercially available valves and pumps may be utilized in the exhaust system 210, and the outlet 208 may comprise a removable outlet to accommodate attachment of particular valves.

A substrate support 216 is also disposed on the chamber bottom 206. The substrate support 216 may be an electrostatic chuck, a vacuum chuck or other wafer holding mechanisms, and includes a substrate supporting surface 218 that is generally shaped to match the shape of a substrate supported thereon. As shown in FIG. 2, the substrate supporting surface 218 is generally round to support a substantially round substrate. The substrate supporting surface 218 may be thermally connected to a substrate temperature control system 228, such as a resistive heating coil and/or fluid passages connected to a heating or cooling fluid system. The substrate support 216 includes a substrate lift mechanism 220 for facilitating substrate transfers onto and off of the substrate support 216. The substrate lift mechanism 220 may include one or more movable lift pins 224 connected to a lift actuator 226. A portion of the substrate support 216 may extend through the chamber bottom 206 to provide housing for the components of the substrate support. The substrate support 216 may be electrically connected to a power source (not shown) to provide a substrate bias as desired for particular processes. Optionally, an actuator for moving the substrate support to different vertical positions may be provided.

The chamber bottom 206 is shaped to accommodate the substantially circular base of the substrate support 216 and the substantially circular chamber outlet 208. As shown in FIG. 3, the chamber wall 204 is shaped to provide an internal volume defined by first and second substantially semi-cylindrical regions 204A, 204B and by side wall portions 204C extending between the first and second semi-cylindrical regions. The first semi-cylindrical region 204A has sufficient space for mounting the substrate support 216 and the second semi-cylindrical region 204B encloses the chamber outlet 208. The first semi-cylindrical region 204A is spaced from an outer surface of the substrate support 216 to provide a gas passageway around the body of the substrate support 216. The second semi-cylindrical region 204B surrounds a portion of the exhaust region above the chamber outlet 208. The side wall portions 204C defines an exhaust passageway connecting the gas passageway around the body of the substrate support 216 to the exhaust region above the chamber outlet 208. The internal volume includes sufficient space for one or more liners defining a cylindrical processing region and cylindrical exhaust region as described in more detail below. In one embodiment as shown in FIG. 3, the side wall portions 204C substantially eliminates any restriction of the conductance (i.e., effectively maximizes conductance) between the gas passageway around the body of the substrate support 216 and the exhaust region above the chamber outlet 208.

Generally, the diameter of the semi-cylindrical section 204A is larger than the diameter of the semi-cylindrical section 204B. However, if a substantially larger vacuum pump needs to be accommodated, the diameter of section 204B may need to be enlarged, perhaps even beyond that of section 204A.

A slit 230 for facilitating substrate transfers into and out of the chamber is disposed on the chamber wall 204 at a position proximate the substrate support 216 and above the substrate supporting surface 218. A slit valve 232 is disposed adjacent to the slit 230 and the chamber wall 204 to facilitate substrate transfers into and out of the chamber (i.e., when slit valve is open) and to maintain desired chamber vacuum levels during processing (i.e., when slit valve is closed). As shown in FIG. 2, the slit valve 232 comprises a plasma isolation slit valve which is moveably disposed against an interior surface of the chamber wall 204. The plasma isolation slit valve is attached to a slit valve actuator 233, such as a pneumatic actuator or other motors, disposed through the chamber bottom 206. The slit valve actuator 233 moves the slit valve 232 between an open position and a closed position.

A chamber lid 234 is sealingly disposed above the chamber wall 204 to provide an enclosed environment inside the chamber for vacuum processing. The chamber lid 234 may be removable or hinged to a portion of the chamber wall 204. The chamber lid 234 may be shaped as a plate or a dome depending on the process for which the chamber is configured and the desired processing parameters. As shown in FIG. 2, the chamber lid 234 is domed shaped and includes an inner coil 236 and an outer coil 238 connected to a power source 240 through a power distribution network 242. Other chamber lid designs having inductive, capacitive, or a combination of inductive and capacitive plasma sources may also be utilized as the chamber lid 234 of the multi-purpose chamber 200. Various inductive and capacative chamber lid designs are shown in U.S. Pat. No. 6,054,013, Collins et al., which is hereby incorporated by reference in its entirety.

A gas distributor 244 is fluidly connected to a gas source 246 containing the precursor or process gases to be utilized for processing the substrate in the chamber. The gas source 246 may include one or more liquid ampoules containing one or more liquid precursors and one or more vaporizers for vaporizing the liquid precursors to a gaseous state. As shown in FIG. 2, the gas distributor 244 may include one or more gas injection nozzles 248 disposed through a central top portion of the chamber lid 234. Alternatively, the gas distributor may comprise a showerhead gas distributor having a plurality of holes for introducing gases into the chamber disposed at a top portion of the chamber lid. As a further alternative, the gas distributor may comprise an annular gas distributor having a plurality of gas nozzles disposed circumferentially above the substrate support. Optionally, a remote plasma source 249 may be fluidly connected to introduce a remote plasma, such as a chamber cleaning plasma. If remote plasma source 249 is used, then a corresponding opening 276 is provided in liner 250. However, if remote plasma source 249 is not used, opening 276 should not be provided in the liner 250.

The multi-purpose chamber 200 includes a liner 250 removably disposed in the chamber which configures the chamber for particular processing, for example, an etch process. The liner 250 is made of nickel, aluminum, or other metals or metal alloys appropriate for plasma processing, and may also include an anodized aluminum surface. The liner 250 may be a single piece construction or a multi-piece construction. As shown in FIG. 3, the liner 250 is a two-piece liner comprising an upper liner 252 and a lower liner 254.

The chamber liner 250 defines a process region above the substrate support surface 218, an exhaust region above the chamber outlet 208, and a passage region between the process region and the exhaust region. The chamber liner 250 is fitted to a the chamber body. Thus, in order to modify the size or shape of either the process region, the exhaust region, or the passage region, one need only replace the chamber liner 250.

The lower liner 254 includes a wall portion 256 that lines a lower interior portion of the chamber wall 204. The lower liner 254 may also include a bottom portion 258 that covers substantially the chamber bottom 206 that may be exposed to processing gases. The bottom portion 258 has holes or openings 260 and 262 to accommodate the substrate support 216 and the outlet 208, respectively.

The upper liner 252 defines the processing region and includes a plasma confinement portion 264 that surrounds the processing region above the substrate support 216. The plasma confinement portion 264 has a substantially cylindrical shape to match a round substrate support 216 and is disposed substantially concentrically with the substrate support 216 to form a substantially uniform passage way between the inner surface of the plasma confinement portion 264 and the outer surface of the substrate support 216. In one embodiment, the plasma confinement portion 264 has an interior diameter of about 560 mm, and the substrate support 216 has an outer diameter of about 380 mm for supporting a 300 mm substrate thereon.

The plasma confinement portion 264 may extend below the substrate supporting surface 218 to enhance uniform plasma distribution over a substrate during processing. The plasma confinement portion 264 provides an RF symmetric volume about the substrate support 216 and uniform plasma confinement around a substrate disposed on the substrate support. The plasma confinement portion 264 includes a slit 265 corresponding in position and size to the slit 230 on the chamber wall 204 to facilitate substrate transfers into and out of the chamber. The slit valve 232 is disposed between the slit 265 of the upper liner 252 and the slit 230 on the chamber wall 204.

In one embodiment, a substantially semi-circular lower edge portion 266 of the plasma confinement portion 264 of the upper liner 252 abuts a substantially semi-circular upper edge portion 268 of the wall portion 256 of the lower liner 254. The upper liner 252 may include an intermediate plate 270 which extends from an outer surface of the plasma confinement portion to the interior surface of the chamber wall 204. The intermediate plate 270 and the lower liner 254 define the exhaust region above the chamber outlet 208 and the passage region between the processing region and the exhaust region.

The upper liner 252 may also include an upper wall portion 272 extending from the edge of the intermediate plate 270 to cover the remaining portions of the interior surface of the chamber wall 204. A flange 274 extends from an upper edge of the upper wall portion 272 and a portion of an upper edge of the plasma confinement portion 264 and is mounted onto an upper surface of the chamber wall 204. In one embodiment, the chamber lid is sealingly disposed above the plasma confinement portion 264 of upper liner. In another embodiment, the chamber lid is sealingly disposed above the chamber wall 204.

Figure 4:
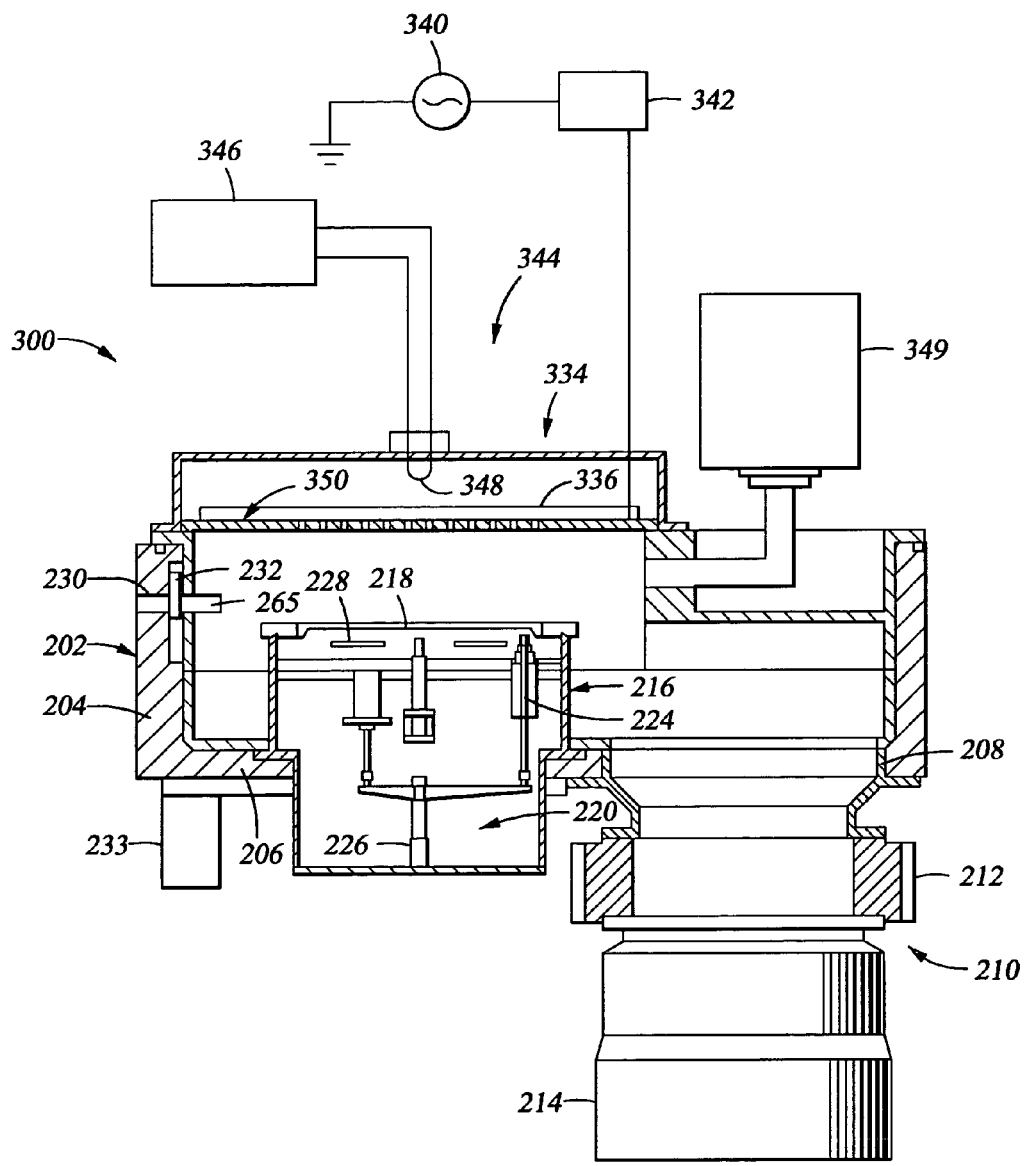
FIG. 4 is a cross sectional view of a multi-purpose chamber of the invention shown with a flat lid and a capacitively coupled gas distribution plate.

FIG. 4 is a cross sectional view of the multi-purpose chamber of FIG. 2 having a flat lid 334 and a gas distribution showerhead 350. The multi-purpose chamber 300 has a multi-purpose chamber body 202 as previously described for FIGS. 2 and 3. A chamber lid 334 is sealingly disposed above the chamber wall 204 to provide an enclosed environment inside the chamber for vacuum processing. The chamber lid 334 may be removable or hinged to a portion of the chamber wall 204. The chamber lid 334 may be shaped as a plate or a dome depending on the process for which the chamber is configured and the desired processing parameters. As shown in FIG. 4, the chamber lid 334 is flat shaped and covers the gas distribution plate 350. Electrode 336 is connected to a power source 340 through a power distribution network 342 to provide capacitive RF coupling to the plasma. A gas distributor 344 is fluidly connected to a gas source 346 containing the precursor or process gases to be utilized for processing the substrate in the chamber. The gas source 346 may include one or more liquid ampoules containing one or more liquid precursors and one or more vaporizers for vaporizing the liquid precursors to a gaseous state. Optionally, a remote plasma source 349 may be fluidly connected to introduce a remote plasma, such as a chamber cleaning plasma.

Figure 5:
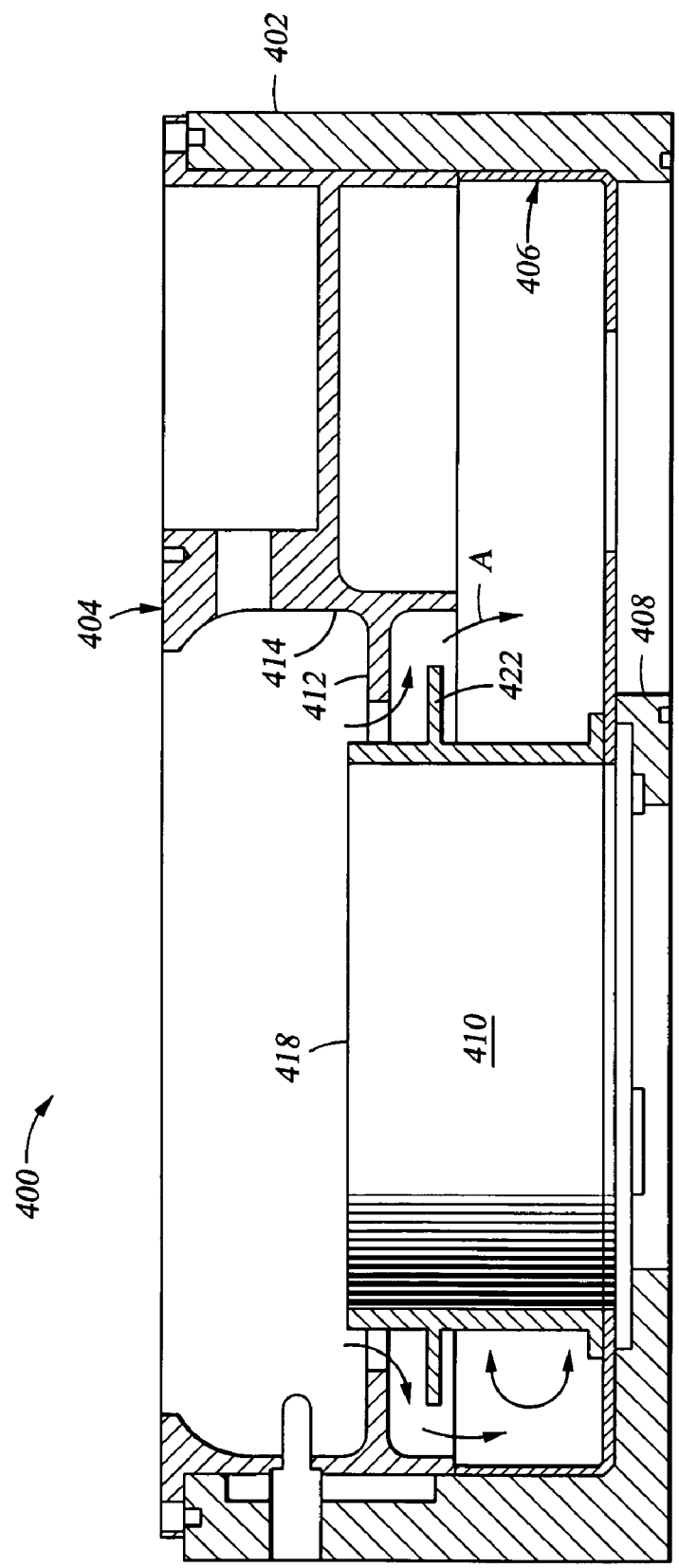
FIG. 5 is a cross sectional view of an embodiment of the multi-purpose chamber of the invention showing the flow of process gases through chamber liners.

FIG. 5 is a cross sectional view of another embodiment of the multi-purpose chamber of the invention showing how the chamber liner defines the processing chamber by configuring processing volume, exhaust volume, and the flow of process gases. The multi-purpose chamber 400 includes similar components as the multi-purpose chamber 200, including a chamber body 402, an upper liner 404, a lower liner 406, a chamber outlet 408 and a substrate support 410. The upper liner 404 includes a flow control flange 412 extending inwardly from an interior surface of the plasma confinement portion 414 of the upper liner 404. The flow control flange 412 is positioned substantially around the substrate support surface 418 of the substrate support 410. The plasma flow or processing gas flow is restricted to the space between the outer surface of the substrate support 410 and the inner surface of the flow control flange 412. The size and shape of the flow control flange 412 may be designed to accommodate desired flow dynamics for particular processes performed in the chamber.

In a further aspect of the invention, the passage region includes traps to prevent plasma escaping from the process region into the passage or exhaust regions. Plasma or process gas flow can be controlled by a flow control flange 422 disposed on an outer surface of the substrate support 410. In this embodiment, the plasma flow or process gas flow is restricted to the space between thinner surface of the plasma confinement portion 414 of the upper liner 404 and the outer surface of the flow control flange 422. Another embodiment includes flow control flanges 412 and 422 disposed on the upper liner 404 and the substrate support 410, respectively, as shown in FIG. 5. The plasma flow or processing gas flow is restricted as indicated by arrows A.

Figure 6A:
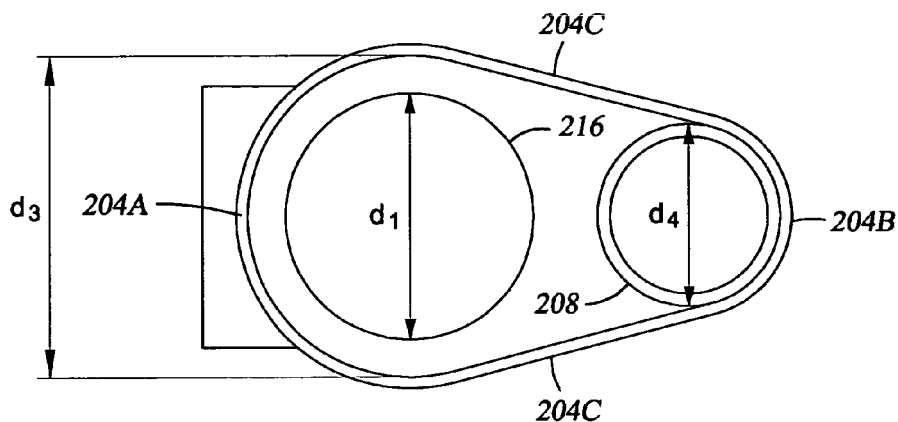
FIGS. 6A–6C are top views of several embodiments of the multi-purpose chamber of the invention.
Figure 6B:
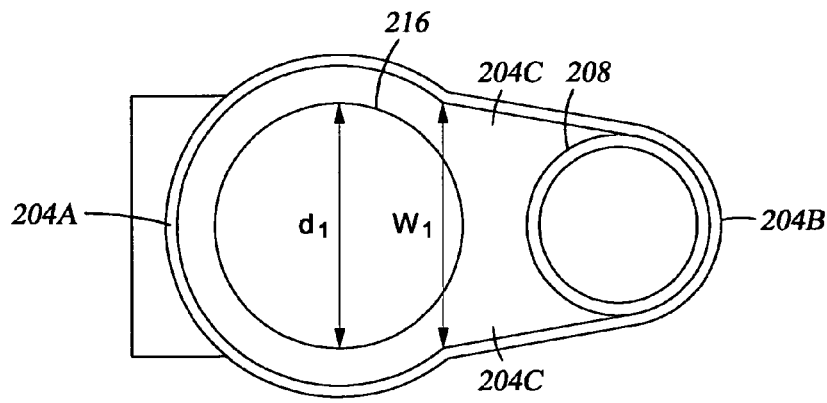
Figure 6C:
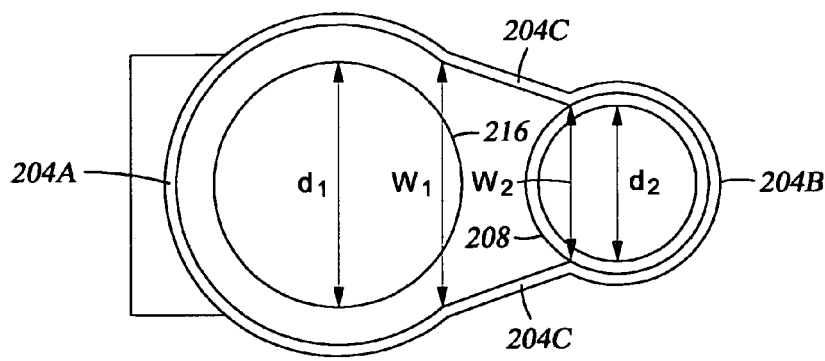

FIGS. 6A–C are top views of embodiments of the chamber of the invention. FIG. 6A shows one embodiment of the chamber where the side wall portions 204C are substantially tangent to the first and second cylindrical regions. In this embodiment, the side wall portions 204C effectively maximizes the conductance between the gas passageway around the body of the substrate support 216 and the exhaust region above the chamber outlet 208. In one embodiment for a chamber configured to process a 300 mm substrate, a diameter d3 (e.g., about 560 mm) of the first cylindrical region is at least about 180 mm (about 47%) wider than a diameter d1 (e.g., about 380 mm) of the body of the substrate support 216 to provide sufficient spacing between the chamber wall and the substrate support to enhance uniform flow of process gases to the chamber outlet, and the second cylindrical region surrounding the chamber outlet has a diameter d4 of about 340 mm to accommodate attachment of a 320 mm outlet valve. In this embodiment, the diameter d3 (about 560 mm) of the first cylindrical region is at least about 65% wider than a diameter d4 (about 340 mm) of the second cylindrical region.

In another embodiment for a chamber configured to process a 300 mm substrate on a substrate support having a diameter d1 of about 380 mm, the diameter d3 of the first cylindrical region is at least about 456 mm and at least about 76 mm (about 20% wider than) of the body of the substrate support. The diameter d3 (about 456 mm) of the first cylindrical region is at least about 30% wider than the diameter d4 (about 340 mm) of the second cylindrical region. The interior chamber dimensions of the above embodiments may also be utilized as interior dimensions of the chamber liner to achieve substantially similar results. Also, the chamber dimensions may be varied correspondingly to process requirements, such as wafer size, and economic restraints, such as limitations in system foot print, clean room space, exhaust pump costs, etc.

FIG. 6B shows one embodiment of the chamber where the side wall portions 204C are substantially tangent to the second cylindrical region and abut the first cylindrical region. The side wall portions 204C may be substantially parallel. In one embodiment, the width W1 between the inner surfaces of the side wall portions 204C adjacent the first cylindrical region is at least as wide as a diameter d1 of the body of the substrate support 216.

FIG. 6C shows one embodiment of the chamber where the side wall portions 204C abut the two cylindrical regions. In the embodiment shown in FIG. 6C, the inner surfaces of the side wall portions 204C are disposed along lines that are tangent to a circumference of the body of the substrate support 216 and an inner circumference of the chamber outlet 208. In one embodiment, the width W1 between the inner surfaces of the side wall portions 204C adjacent the first cylindrical region is at least as wide as a diameter d1 of the body of the substrate support 216. Also, the width W2 between the inner surfaces of the side wall portions 204C adjacent the second cylindrical region is at least as much as the internal diameter d1 of the chamber outlet 208.

Figure 7:
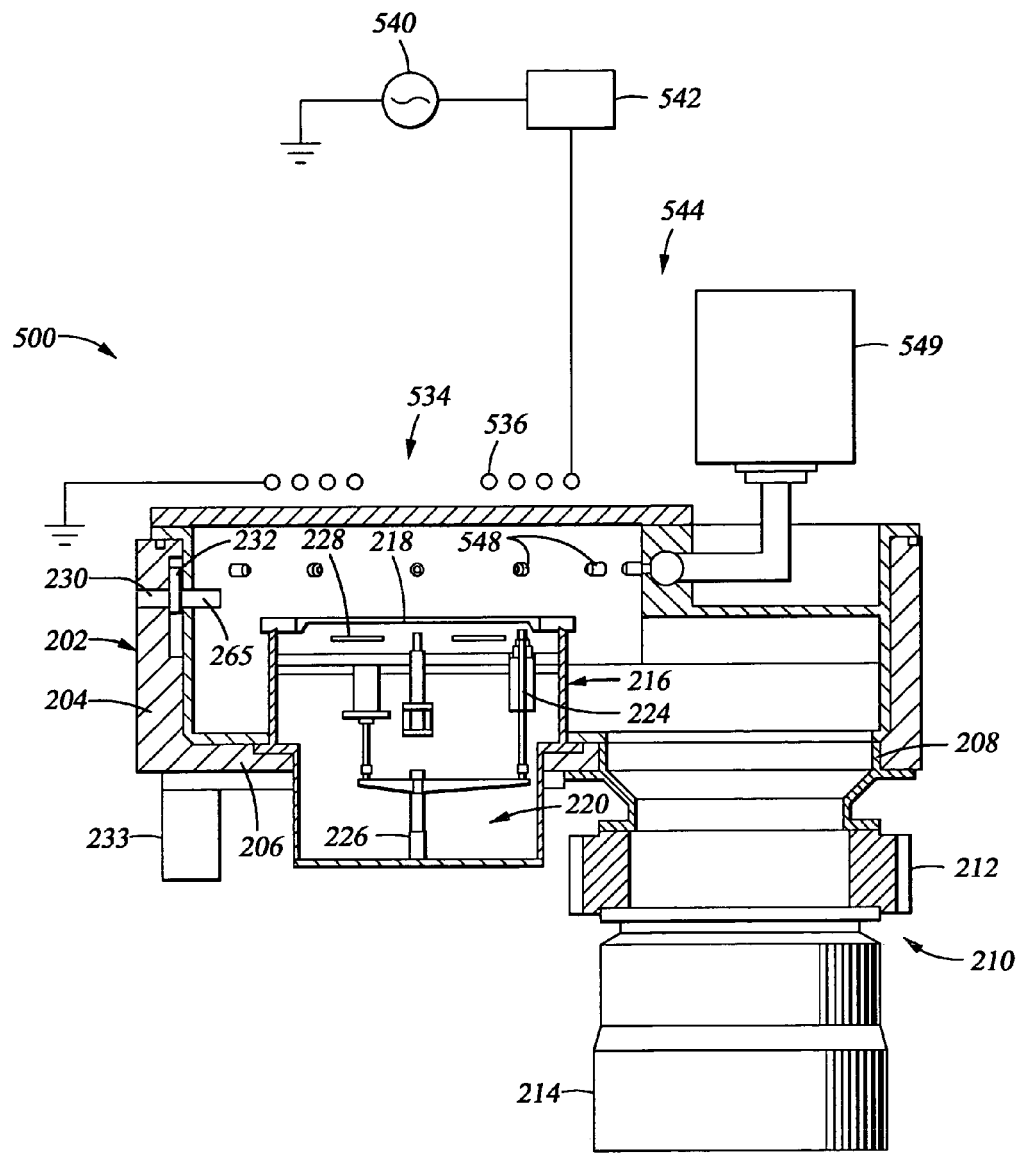
FIG. 7 is a cross sectional view of a multi-purpose chamber of the invention shown with a flat lid and a flat coil.
Figure 8:
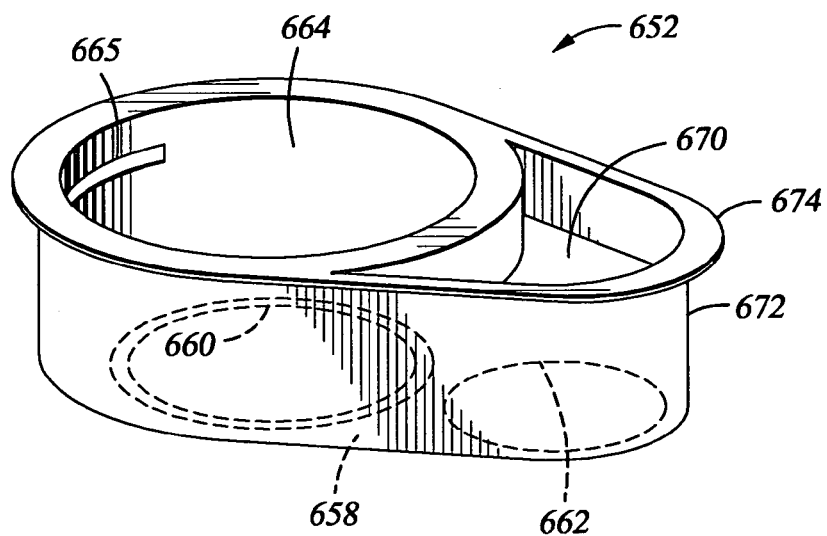
FIG. 8 is an exploded perspective view of a multi-purpose chamber having a one-piece liner.
Figure 8:
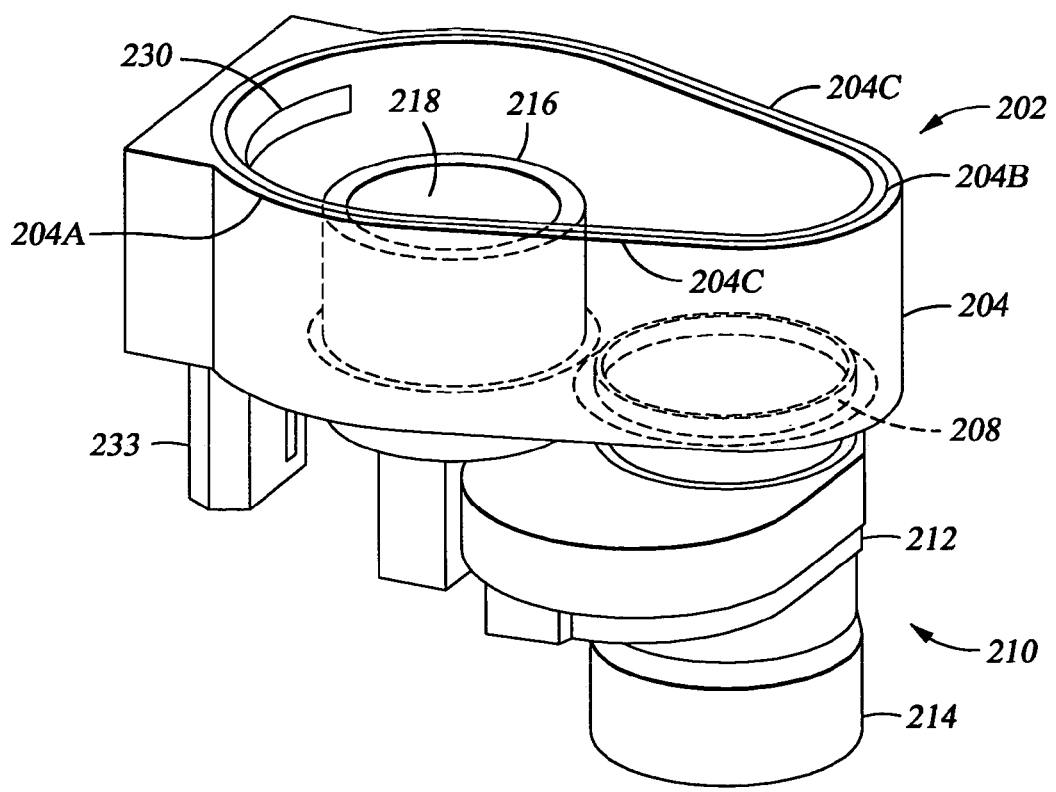

FIG. 7 is a cross sectional view of the multi-purpose chamber of FIG. 2 having a flat lid 534 and gas distribution nozzles 548 positioned through the chamber side wall. The multi-purpose chamber 500 has a multi-purpose chamber body 202 as previously described for FIG. 2. FIG. 8 is an exploded perspective view of a multi-purpose chamber having a one-piece liner.

A chamber lid 534 is sealingly disposed above the chamber wall 204 to provide an enclosed environment inside the chamber for vacuum processing. The chamber lid 534 may be removable or hinged to a portion of the chamber wall 204. The chamber lid 534 is flat and underlies a flat coil 536 connected to a power source 540 through a power distribution network 542. A gas distributor 544 having a gas source 549 may include one or more of the gas injection nozzles 548 disposed through the side wall circumferentially above the substrate support 216.

The multi-purpose chamber 500 includes a liner removably disposed in the chamber which configures the chamber for particular processing, for example, an etch process. The liner is made of nickel, aluminum, or other metals or metal alloys appropriate for plasma processing, and may also include an anodized aluminum surface. The liner may be a single piece construction or a multi-piece construction. As shown in FIG. 8, the liner is a one-piece liner 652. The liner 652 includes a wall portion 672 that lines the chamber wall 204. The liner 652 may also include a bottom portion 658 that covers substantially the chamber bottom 206 that may be exposed to processing gases. The bottom portion 658 has holes or openings 660 and 662 to accommodate the substrate support 216 and the outlet 208, respectively. The liner 652 includes a plasma confinement portion 664 that surrounds a processing region above the substrate support 216. The plasma confinement portion 664 has a substantially cylindrical shape to match a round substrate support 216 and is disposed substantially concentrically with the substrate support 216 to form a substantially uniform passage way between the inner surface of the plasma confinement portion 664 and the outer surface of the substrate support 216.

The plasma confinement portion 664 may extend below the substrate supporting surface 218 to enhance uniform plasma distribution over a substrate during processing. The plasma confinement portion 664 provides an RF symmetric volume about the substrate support 216 and uniform plasma confinement around a substrate disposed on the substrate support. The plasma confinement portion 664 includes a slit 665 corresponding in position and size to the slit 230 on the chamber wall 204 to facilitate substrate transfers into and out of the chamber. The slit valve 232 is disposed between the slit 665 of the liner 652 and the slit 230 on the chamber wall 204. A flange 674 extends from an upper edge of the wall portion 672 and is mounted onto an upper surface of the chamber wall 204. In one embodiment, the chamber lid is sealingly disposed above the plasma confinement portion 664 of the upper liner. In another embodiment, the chamber lid is sealingly disposed above the chamber wall 204.

The liner 652 may also include an intermediate plate 670 which extends from an outer surface of the plasma confinement portion to the interior surface of the chamber wall 204. The intermediate plate 670 and the liner 652 define the exhaust region above the chamber outlet 208 and the passage region between the processing region and the exhaust region.

Figure 9:
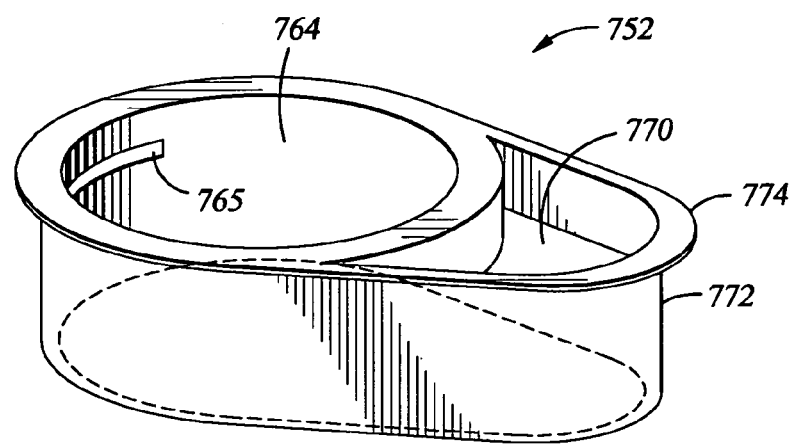
FIG. 9 is an exploded perspective view of a multi-purpose chamber having a one-piece liner that does not cover the chamber bottom.
Figure 9:
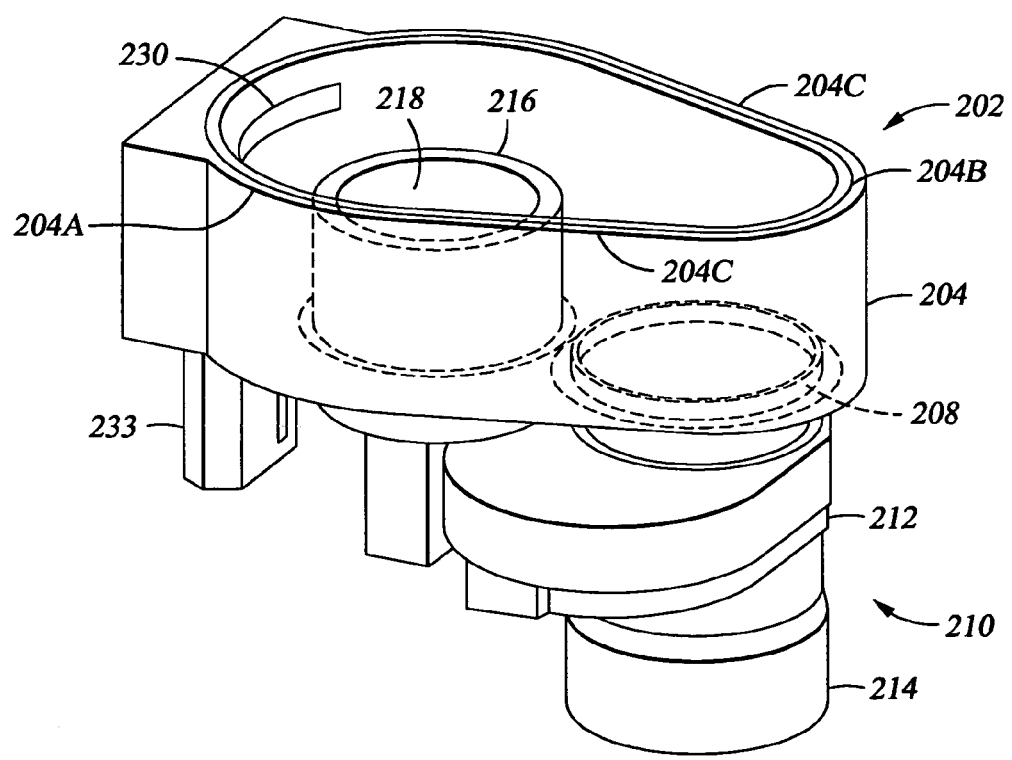

Referring to FIG. 9, the removable liners can leave the chamber bottom exposed. The liner shown in FIG. 9 is a one-piece liner 752. The liner 752 includes a wall portion 772 that lines the chamber wall 204. The liner 752 includes a plasma confinement portion 764 that surrounds a processing region above the substrate support 216. The plasma confinement portion 764 has a substantially cylindrical shape to match a round substrate support 216 and is disposed substantially concentrically with the substrate support 216 to form a substantially uniform passage way between the inner surface of the plasma confinement portion 764 and the outer surface of the substrate support 216.

The plasma confinement portion 764 may extend below the substrate supporting surface 218 to enhance uniform plasma distribution over a substrate during processing. The plasma confinement portion 764 provides an RF symmetric volume about the substrate support 216 and uniform plasma confinement around a substrate disposed on the substrate support. The plasma confinement portion 764 includes a slit 765 corresponding in position and size to the slit 230 on the chamber wall 204 to facilitate substrate transfers into and out of the chamber. The slit valve 232 is disposed between the slit 765 of the liner 752 and the slit 230 on the chamber wall 204. A flange 774 extends from an upper edge of the wall portion 772 and is mounted onto an upper surface of the chamber wall 204. In one embodiment, the chamber lid is sealingly disposed above the plasma confinement portion 764 of the upper liner. In another embodiment, the chamber lid is sealingly disposed above the chamber wall 204.

The liner 752 may also include an intermediate plate 770 which extends from an outer surface of the plasma confinement portion to the interior surface of the chamber wall 204. The intermediate plate 770 and the liner 752 define the exhaust region above the chamber outlet 208 and the passage region between the processing region and the exhaust region.

While foregoing is directed to the preferred embodiment of the present invention, other and further embodiments of the invention may be devised without departing from the basic scope thereof, and the scope thereof is determined by the claims that follow. Specifically, it should be apparent that the various chamber liners and lids disclosed herein may be "mixed and matched" to result in various chamber designs without the need for changing the chamber body.

What is claimed is:

1. An apparatus for processing a semiconductor substrate, comprising:
    a chamber body having an internal volume defined by first and second substantially cylindrical regions and by side walls extending substantially tangent between the first and second substantially cylindrical regions;
    a substrate support disposed in the internal volume within the first substantially cylindrical region; and
    an exhaust system connected to a chamber outlet disposed in fluid communication with the second substantially cylindrical region.

2. The apparatus of claim 1, further comprising:
    a chamber lid mounted on the chamber body; and
    an electrode disposed on the chamber lid.

3. The apparatus of claim 2, wherein the electrode comprises one or more inductive coils.

4. The apparatus of claim 2, wherein the electrode comprises one or more flat coils.

5. An apparatus for processing a substrate, comprising:
    a chamber body having an internal volume, wherein the internal volume is defined by first and second substantially cylindrical regions and by straight side walls substantially tangent to the first and second substantially cylindrical regions;
    one or more liners defining within the internal volume a substantially cylindrical processing region within the first substantially cylindrical region and a substantially cylindrical exhaust region within the second substantially cylindrical region, wherein the substantially cylindrical processing region communicates with the substantially cylindrical exhaust region through one or more openings defined by the one or more liners;

a substrate support disposed in the substantially cylindrical processing region; and an exhaust system in communication with the substantially cylindrical exhaust region through an exhaust port in the process chamber.

6. The apparatus of claim 5, wherein the first substantially cylindrical region is parallel to the second substantially cylindrical region.

7. The apparatus of claim 6, wherein the first substantially cylindrical region has a first diameter at least 30% larger than a second diameter of the second substantially cylindrical region.

8. The apparatus of claim 6, wherein the first substantially cylindrical region has a first diameter at least 20% larger than a substrate support diameter.

9. An apparatus for processing a substrate, comprising:
a chamber body comprising an internal volume and an exhaust port, wherein the internal volume is defined by at least first and second substantially cylindrical regions and by straight side walls substantially tangent to the first and second substantially cylindrical regions;

one or more liners defining an exhaust region and a processing region within the internal volume, wherein the exhaust region is co-axial with the exhaust port and the processing region is on a parallel axis with the exhaust region, and wherein the one or more liners define the processing region in the first substantially cylindrical region and define the exhaust region in the second substantially cylindrical region; and a substrate support disposed in the processing region.

10. The apparatus of claim 9, wherein the first substantially cylindrical region has a first diameter at least 30% larger than a second diameter of the second cylindrical region.

11. The apparatus of claim 9, wherein the first substantially cylindrical region has a first diameter at least 20% larger than a substrate support diameter.

* * * * *

UNITED STATES PATENT AND TRADEMARK OFFICE
CERTIFICATE OF CORRECTION

PATENT NO. : 7,011,039 B1  Page 1 of 1
APPLICATION NO. : 09/611817
DATED : March 14, 2006
INVENTOR(S) : Jonathan D. Mohn, John J. Helmsen and Michael Barnes It is certified that error appears in the above-identified patent and that said Letters Patent is hereby corrected as shown below:

Column 3, Line 38: Change "1110" to --110--

Column 7, Line 64: Change "thinner" to --the inner--

Signed and Sealed this

Fourteenth Day of November, 2006

JON W. DUDAS
*Director of the United States Patent and Trademark Office*